United States Patent
Lalla

(10) Patent No.: US 11,092,631 B2
(45) Date of Patent: Aug. 17, 2021

(54) DRIVER CIRCUIT, CONVERTER ELECTRONICS FORMED THEREWITH AND MEASURING SYSTEM FORMED THEREWITH

(71) Applicant: Endress + Hauser Flowtec AG, Reinach (CH)

(72) Inventor: Robert Lalla, Förrach (DE)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 261 days.

(21) Appl. No.: 16/324,370

(22) PCT Filed: Jul. 14, 2017

(86) PCT No.: PCT/EP2017/067826
§ 371 (c)(1),
(2) Date: Apr. 23, 2019

(87) PCT Pub. No.: WO2018/028932
PCT Pub. Date: Feb. 15, 2018

(65) Prior Publication Data
US 2020/0386597 A1    Dec. 10, 2020

(30) Foreign Application Priority Data

Aug. 10, 2016    (DE) .................... 10 2016 114 860.1

(51) Int. Cl.
*G01R 27/00* (2006.01)
*G01F 1/84* (2006.01)

(52) U.S. Cl.
CPC ........... *G01R 27/00* (2013.01); *G01F 1/8413* (2013.01); *G01F 1/8431* (2013.01); *G01F 1/8436* (2013.01)

(58) Field of Classification Search
None
See application file for complete search history.

(56) References Cited

U.S. PATENT DOCUMENTS

| | | | |
|---|---|---|---|
| 5,050,439 | A | 9/1991 | Thompson |
| 2003/0056574 | A1 | 3/2003 | Drahm et al. |

(Continued)

FOREIGN PATENT DOCUMENTS

| | | |
|---|---|---|
| CN | 10 2859852 B | 1/2013 |
| CN | 10 4956592 B | 9/2015 |

(Continued)

OTHER PUBLICATIONS

Office Action dated Dec. 25, 2019 in corresponding Chinese application No. 201780048821.4.

(Continued)

*Primary Examiner* — Harshad R Patel
(74) *Attorney, Agent, or Firm* — Bacon & Thomas, PLLC

(57) ABSTRACT

In a driver circuit having a signal generator, end stage and amplitude control, the signal outputs an analog signal to a signal input of the end stage, with an amplitude predetermined by an amplitude control value. A load output of the end stage is connected with a voltage measurement input of the amplitude control providing a load current having an electrical current level dependent on an electrical input signal applied on signal input and a load voltage having a voltage level dependent on the electrical current level of the load current. The amplitude control ascertains an amplitude deviation between actual and desired amplitude values for ascertaining an indicator value, which signals that a magnitude of a measurement voltage input is too high, if a threshold value has been exceeded and, if so, to ascertain an amplitude control value lessening further amplitude control values outputted to the amplitude control input.

18 Claims, 5 Drawing Sheets

(56) References Cited

U.S. PATENT DOCUMENTS

| | | | | |
|---|---|---|---|---|
| 2006/0161359 A1* | 7/2006 | Lalla | ................ | G01F 1/8431 |
| | | | | 702/65 |
| 2008/0015799 A1* | 1/2008 | Lalla | ................ | G01F 1/8409 |
| | | | | 702/65 |
| 2008/0133152 A1 | 6/2008 | Nitschke et al. | | |
| 2011/0271756 A1* | 11/2011 | Lalla | ................ | G01F 1/8422 |
| | | | | 73/32 A |
| 2012/0310545 A1* | 12/2012 | Drahm | ............. | G01F 1/8431 |
| | | | | 702/22 |

FOREIGN PATENT DOCUMENTS

| | | |
|---|---|---|
| CN | 10 4995490 A | 10/2015 |
| CN | 10 5308432 A | 2/2016 |
| DE | 10 2006 030 962 A1 | 1/2008 |
| DE | 10 2010 000 759 A1 | 7/2011 |
| DE | 10 2010 044 179 A1 | 5/2012 |
| DE | 10 2011 006 997 A1 | 10/2012 |
| DE | 10 2013 113 689 A1 | 6/2015 |
| WO | 93/22629 A1 | 11/1993 |
| WO | 99/02945 A1 | 1/1999 |
| WO | 2007/035376 A2 | 3/2007 |

OTHER PUBLICATIONS

German Search Report, German PTO, Munich, dated Mar. 22, 2017.
International Search Report, EPO, The Netherlands, dated Nov. 9, 2017.

\* cited by examiner

DRIVER CIRCUIT, CONVERTER ELECTRONICS FORMED THEREWITH AND MEASURING SYSTEM FORMED THEREWITH

BACKGROUND DISCUSSION

The invention relates to a driver circuit for an, especially inductive, load circuit as well as to a transmitter electronics formed therewith, especially an intrinsically safe, transmitter electronics, and to a measuring system having such a transmitter electronics, especially to a measuring system embodied as a two-conductor field device and/or a vibronic measuring system.

Applied on-site or process-near in industrial measuring- and automation technology for producing measured value signals analogly or digitally representing measured variables are measuring systems—so-called field devices. The measured value to be registered in each case can be, for example, a mass flow, e.g. a mass flow rate, a density, a viscosity, a fill level- or a limit-level, a pressure, a temperature, etc., of a flowable-, or bulk good, dumpable medium, for example, thus, a liquid, powdered-, vaporous- or gaseous medium, which is conveyed or kept in a corresponding process container, such as e.g. a pipeline or a tank. Further examples of such field devices, per se known to those skilled in the art, are described at length and in detail in, among others, DE-A 39 34 007, EP-A 1 058 093, EP-A 1 158 289, EP-A 525 920, EP-A 984 248, U.S. Pat. Nos. 3,764,880, 3,878,725, 4,308, 754, 4,317,116, 4,468,971, 4,524,610, 4,574,328, 4,594,584, 4,617,607, 4,656,353, 4,768,384, 4,850,213, 4,926,340, 5,024,104, 5,052,230, 5,068,592, 5,131,279, 5,207,101, 5,231,884, 5,359,881, 5,363,341, 5,416,723, 5,469,748, 5,535,243, 5,604,685, 5,672,975, 5,687,100, 5,742,225, 5,742,225, 5,796,011, 5,959,372, 6,006,609, 6,014,100, 6,140,940, 6,236,322, 6,269,701, 6,285,094, 6,311,136, 6,397,683, 6,476,522, 6,480,131, 6,487,507, 6,512,358, 6,535,161, 6,574,515, 6,577,989, 6,662,120, 6,769,301, 6,776,053, 6,799,476, 7,200,503, 7,630,844, US-A 2008/0015799, US-A 2011/0271756, US-A 2015/0177192, WO-A 2014/163635, WO-A 00/14485, WO-A 00/26739, WO-A 00/36379, WO-A 00/48157, WO-A 00/67087, WO-A 01/02816, WO-A 02/086426, WO-A 02/103327, WO-A 02/45045, WO-A 2004/048905, WO-A 2005/040735, WO-A 2006/130087, WO-A 2010/014102, WO-A 88/02476, WO-A 88/02853 and WO-A 95/16897. The therein shown measuring systems have, in each case, a physical-electrical measuring transducer for registering the measured variable(s) as well as a transmitter electronics electrically connected therewith, most often supplied with electrical energy from the outside, and having a circuit arrangement, at times, also referred to as an operating circuit, operating the measurement transducer—, —as well as a measurement—and control circuit connected with the circuit arrangement, for example, a measurement—and control circuit formed by means of a microcontroller and/or by means of a digital signal processor, for producing measured values representing the at least one measured variable. For accommodating electronic assemblies forming the transmitter-electronics, field devices comprise, furthermore, an electronics-housing, which, such as provided e.g. in U.S. Pat. No. 6,397,683 or WO-A 00/36379, is arranged removed from the measurement transducer and can be connected with such via a flexible cable, or which, such as provided e.g. in EP-A 903 651 or EP-A 1 008 836, is arranged directly on measurement transducer or on a measuring transducer housing separately housing the measurement transducer.

The measuring transducer is, in such case, adapted to be inserted into a wall of the container containing the medium or into the course of a line, for example, a pipeline, conveying the medium, and serves to produce at least one electrical measurement signal representing the at least one measured variable. For such purpose, the measuring transducer, namely an actuator provided therein, is so driven during measurement system operation by a driver signal, for example, a bipolar driver signal and/or at least a driver signal periodic as a function of time, generated by the driver circuit provided in the transmitter electronics that the measuring transducer acts on the medium in a manner suitable for the measuring, in order to bring about there reactions corresponding to the measured variable to be registered and correspondingly convertible into the at least one measurement signal. The driver signal can be, in such case, for example, an analog- or even a suitably clocked binary signal correspondingly controlled as regards an electrical current level, a voltage level and/or a signal frequency. Examples of such active measuring transducers, thus measuring transducers appropriately converting an electrical driver signal by means of a, for example, predominantly inductive, actuator into a measurable effect serving for registering the measured variable, include, especially, HF transmitting/receiving transducers working according to the echo principle or flow measuring transducers serving for measurement of flowing media and having at least one magnetic field producing coil operated by the driver signal, for example, also measuring transducers of vibration-type with at least one vibrating measuring tube and an electro-mechanical oscillation exciter acting thereon, or at least one ultrasonic transmitter driven by the driver signal, etc. For example, a driver circuit of the type being discussed disclosed in US-A 2011/0271756 includes, among other things, a signal generator having a frequency control input, an amplitude control input and a signal output, as well as an end stage having a signal input and a load output. The signal generator is adapted to output on its signal output an at least at times periodic, in given cases, also at least at times harmonic, electrical, analog signal having a signal frequency predetermined by a frequency control value (for example, a frequency control value delivered by the measurement—and control circuit) applied on the frequency control input and a voltage- and/or electrical current amplitude predetermined by an amplitude control value (for example, an amplitude control value likewise delivered by the measurement—and control circuit) applied on the amplitude control input, while the end stage is adapted to drive by its load output a load current having an electrical current level dependent on a signal voltage and/or a signal current of an electrical input signal applied on the signal input as well as to provide a load voltage having a voltage level dependent on the electrical current level of the load current. In the case of this driver circuit, the signal output of the signal generator is electrically connected with the signal input of the end stage and the load output of the end stage is electrically connected with a load circuit, here embodied as a component of an electro-mechanical or electro-magnetic actuator of a physical-electrical measuring transducer, or formed by means of at least one coil, in such a manner that the electrical current level of the load current output from the end stage depends on the voltage and/or the electrical current of the electrical, analog signal output by the signal generator and the load voltage falls across the load circuit. For the purpose of producing the measured values representing measured variable(s) to be registered by means of the measurement system, the at least one measurement signal is then fed to the above described measurement—and control circuit provided in the transmitter electronics. Additionally, the measurement—and control circuit is adapted to calculate corresponding control commands and setting parameters for the driver circuit, for example, based on an amplitude-actual value and an amplitude-desired value of a current-amplitude control value and/or based on a frequency-actual value and a frequency-desired value of a current-frequency control value, and to transmit such to the driver circuit, for example, in the form of digital values.

Measuring systems of the described type are, furthermore, usually connected with one another via a data transfer-system connected to the transmitter electronics and/or with a corresponding (central) evaluating-unit formed, for example, by means of process-control computers, where they send the measured value signals e.g. via a (4 mA to 20 mA)—electrical current loop and/or via digital data-bus and/or from where they, in corresponding manner, receive operating data and/or control commands. Serving as data transfer-systems, in such case, are, especially serial, field-bus-systems, such as e.g. PROFIBUS-PA, FOUNDATION FIELDBUS as well as the corresponding transmission protocols. By means of the process-control computers, the transmitted measured value signals can be further processed and displayed as corresponding measurement results e.g. on monitors or e.g. also be converted into control signals for actuating devices, such as e.g. magnet-valves, electric-motors, etc., serving for process control. In the case of modern measuring systems of the type being discussed, of concern, additionally, are often so-called two-conductor field devices, thus, field devices, in the case of which the transmitter electronics is electrically connected with the external electrical energy supply to form an electrical current loop only via a single pair of electrical lines, which is flowed through by a supply electrical current supplied from the energy supply and in the case of which the transmitter-electronics also transmits the instantaneous measured value via the same pair of electrical lines to an evaluation unit provided in the external electrical energy supply and/or electrically coupled with such. Examples of such measuring systems, in given cases, also formed as intrinsically safe, two-conductor field devices, can be found in, besides the above mentioned US-A 2011/0271756, among others, also WO-A 05/040735, WO-A 04/048905, WO-A 02/45045, WO-A 02/103327, WO-A 00/48157, WO-A 00/26739, WO-A 94/20940, U.S. Pat. Nos. 6,799,476, 6,577,989, 6,662,120, 6,574,515, 6,535,161, 6,512,358, 6,480,131, 6,311,136, 6,285,094, 6,269,701, 6,140,940, 6,014,100, 5,959,372, 5,742,225, 5,672,975, 5,535,243, 5,416,723, 5,207,101, 5,068,592, 4,926,340, 4,656,353, 4,317,116, 3,764,880, US-A 2008/0015799, U.S. Pat. Nos. 7,200,503, 7,630,844, WO-A 00/67087, WO-A 2010/014102, EP-A 1 147 841, EP-A 1 058 093, EP-A 525 920 or DE-A 39 34 007. Such two-conductor field devices can, for example, be so designed that an instantaneous electrical current level of the supply current instantaneously flowing in the single pair line serving as part of an electrical current loop and set to a magnitude lying between 4 mA and 20 mA (=milliampere) simultaneously also represents the analog measured value produced instantaneously by the measurement system. As a result of this, a special problem of such two-conductor field devices is that an available electrical power at least nominally convertible, and to be converted, by the transmitter-electronics can fluctuate during operation in practically unpredictable manner over a broad range.

Measuring systems of the type being discussed are, additionally, often also so embodied that they satisfy the requirements of intrinsic explosion safety. In accordance therewith, such a field device is operated only with such a low electrical power that by not reaching ignition conditions sparks or arcs are not electrically emitted, and that within the field device even locally no ignition temperatures can be reached. Intrinsically safe explosion protection is defined, for example, in European standards EN 50 014 and EN 50 020, and the ignition protection type "intrinsic safety (Ex-i)" defined therein is met, when electronic apparatuses, consequently field devices, are so embodied that maximum electrical currents, voltages and powers occurring therein in no case exceed predetermined electrical current-, voltage- and power limit values. Namely, limit values are, in each case, so selected that in the case of malfunction, for instance, a short circuit, the maximum released energy is not sufficient to produce ignition capable sparking, and the maximum converted electrical power does not exceed 1 W (=Watt). The voltage can be kept under the predetermined limit values e.g. passively by Z-diodes, the electrical current, for example, also the above-mentioned load current, passively by corresponding limiting resistances and the (maximum available) power by corresponding combining of active and/or passive voltage- and electrical current limiting components.

In the case of measuring systems of the type being discussed, it can, consequently, at times, occur that the electrical current level of the load current actually required for an optimal operation of the load circuit containing the measurement transducer is occasionally no longer set by means of the end stage of the driver circuit, such that the measurement transducer feeding, driver signal can, at times, not be delivered with the signal quality required, for example, for the, at times, arising case, in which the instantaneously available electrical power is due to measuring system related limitations too small relative to the power actually instantaneously required in the driver circuit for an optimal operation, or for the case, in which due to a too low signal level of the measurement signal the measurement—and control circuit transmits control commands, or setting parameters, to the driver circuit, which can lead to an overdriving of the end stage along with a distortion of the load current, or to load voltage (clipping). Such overloading of the driver circuit can occur in the case of a measuring system formed as a two-conductor field device, for instance, as a result of a minimum magnitude of the measured variable to be registered and/or in the case of a vibronic measuring system formed by means of a measuring transducer of vibration-type, in given cases, also intrinsically safely designed, as a result of a very high and/or quickly increasing mechanical damping of the excited mechanical oscillations of the at least one measuring tube, such as can be observed, for instance, in the measurement of a high viscosity liquid and/or a dispersion, such as in the case e.g. of a liquid having gas inclusions, or in the case of too high mutual induction in the (inductive) load circuit, or during a starting up of the measurement system. As discussed in, among others, the above referenced US-A 2011/0271756 or US-A 2015/0177192, it can, for example, in the case of a vibronic measuring system of the above described type for the purpose of assuring the desired high accuracy of measurement, conversely, however, be required that the load current, at least, however, a spectral component thereof appropriate for the measurable effect to be used, flowing in the relevant actuator and in the load circuit formed therewith, corresponds during measurement as regards amplitude, phase position and behavior as a function of time, for example, an as ideally as possible sinusoidal form, to earlier predetermined specifications as exactly as possible; this, for example, in order to assure that oscillations of the at least one measuring tube are excited only in a certain oscillatory mode and/or with a certain frequency, and that an exciting of undesired oscillations, i.e. frequencies, is prevented, and in order to assure that the measurement system operates stably in a predetermined working range. Additionally, it can also be required, during operation of the measurement system, at times, with targeting, to reduce the load current, for instance, in order to be able to execute to diagnostic functions in the measurement system.

In the case of a transmitter-electronics disclosed in US-A 2015/0177192, the measurement—and control circuit continuously measures and evaluates both the output of the end stage, consequently the load voltage falling across the load circuit as well as also the load current driven by the end stage and flowing through the load circuit. This is done for the purpose of providing early detection of, and preventing, overloadings of the driver circuit. As soon as it is detected that such an overload situation is present, or is starting, that namely, for example, the load current exceeds a predetermined threshold value representing a maximum allowable load current or the load voltage exceeds a predetermined threshold value representing a maximum allowable load voltage or, even, an electrical power instantaneously converted in the load circuit exceeds a predetermined threshold value representing a maximum allowable power, a correspondingly reduced amplitude-desired value for the oscillation amplitude to be set for the at least one measuring tube is specified and transmitted from the measurement—and control circuit to the driver circuit.

A disadvantage of such a method, and of such a circuit arrangement, is, however that additional electronic components and assemblies are required, such as e.g. a resistor flowed through by the load current and, consequently, reacting on the driver circuit, for a load current proportional measurement voltage as well as at least two additional ND-transducers for digitizing load current and voltage, which, in turn, further increase the power requirement of the driver circuit.

SUMMARY OF THE INVENTION

Starting from the above discussed factors, an object of the invention is to provide a driver circuit suitable for measuring systems with active measuring transducers, consequently also for two-conductor field devices and/or for vibronic measuring systems, in the case of which also without direct measuring of the load current above-mentioned overload situations can be prevented or at least detected early and, thus, quickly remedied; this, especially, also in such a manner that a continuing overdriving of an end stage, and an unrecognized, and continuing operating of the end stage in a no longer linear, saturation region can be prevented.

For achieving the object, the invention resides in a driver circuit, comprising: a signal generator having a frequency control input, an amplitude control input and a signal output, an end stage (for example, an end stage operated by means of a (bipolar) direct voltage) having a signal input and a load output, as well as an amplitude control (for example, an amplitude control formed by means of a microprocessor) having a digital or analog amplitude input, a digital or analog amplitude output and a voltage measurement input. The signal generator is, especially, adapted to output on its signal output an at least at times periodic—, for example, also at least at times harmonic—electrical, analog signal having a signal frequency predetermined by a digital or analog frequency control value applied on the frequency control input and a voltage- and/or electrical current amplitude predetermined by a digital or analog amplitude control value applied on the amplitude control input. The end stage of the driver circuit of the invention is adapted to drive through an electrical circuit involving the load output a load current having an electrical current level dependent on a signal voltage and/or a signal current of an electrical input signal applied on the signal input as well as to provide on the load output a load voltage having a voltage level dependent on the electrical current level of the load current. Moreover, the amplitude control of the driver circuit of the invention is adapted, recurringly, to ascertain an amplitude deviation, namely a relative or absolute deviation between an amplitude-actual value presiding on the amplitude input and an amplitude desired value, for example, one provided in the amplitude control and/or transmitted to such. Additionally, the amplitude control is adapted, recurringly, to ascertain an indicator value, which signals whether a magnitude of a measurement voltage applied on the voltage measurement input is too high, namely whether the magnitude has, for example, exceeded a threshold value provided in the amplitude control and/or transmitted to such, and, with application of the indicator value, especially to ascertain a digital amplitude control value and/or an amplitude control value serving for lessening, or minimizing, the amplitude deviation, in such a manner that in the case of a too high magnitude of the measurement voltage sequentially following amplitude control values of the amplitude control sequence are lessened, especially also in the case of an increasing amplitude deviation and/or successively, as well as to output on the amplitude output an amplitude control sequence, namely a sequence of amplitude control values calculated timewise one after the other. Additionally in the case of the driver circuit of the invention, the signal output of the signal generator is electrically connected with the signal input of the end stage and the load output of the end stage is electrically connected with the voltage measurement input of the amplitude control, in such a manner that the electrical current level of the load current output from the end stage is dependent on the voltage and/or the electrical current of the electrical, analog signal output from the signal generator and the load voltage lies on the voltage measurement input of the amplitude control, and, additionally, the amplitude output of the amplitude control is electrically connected with the amplitude control input of the signal generator, in such a manner that the voltage- and/or electrical current amplitude of the analog signal are/is predetermined by amplitude control values of the amplitude control sequence applied on the amplitude control input.

Furthermore, the invention resides in a transmitter-electronics with such a driver circuit and with, for example, a load circuit embodied as a component of an electromechanical- or electromagnetic-actuator of a physical-electrical measuring transducer and/or formed by means of at least one coil. In the case of the transmitter electronics of the invention, additionally, the load output of the end stage is electrically connected both with the voltage measurement input of the amplitude control as well as also with the load circuit, in such a manner that the load voltage is both applied to the voltage measurement input of the amplitude control as well as also falls across the load circuit.

Moreover, the invention resides in a measuring system having such a, for example, also intrinsically safe, transmitter electronics as well as a measuring transducer electrically connected to the transmitter electronics and adapted to register at least one physical, measured variable, for example, a mass flow rate and/or a density and/or a viscosity of a fluid guided in a pipe, tube or pipeline or a fill level of a bulk good held in a container, and to transduce such into a corresponding measurement signal, in such a manner that the measurement signal follows a change of the physical, measured variable with a change of at least one signal parameter, for example, a signal amplitude, a signal frequency and/or a phase angle.

In a first embodiment of the driver circuit of the invention, it is provided that the amplitude control is adapted to ascertain a time fraction, in which the measurement voltage is during a predetermined measurement interval, as a whole, too high, and the amplitude control is adapted so to ascertain the indicator value that such quantifies the time fraction, for example, relatively, i.e. with reference to the measurement interval.

In a second embodiment of the driver circuit of the invention, it is provided that the load voltage, thus the measurement voltage applied on the voltage measurement input of the amplitude control, has, at least at times, a periodic behavior, for example, in such a manner that the load voltage, and the measurement voltage, changes over a time period of at least two periods with a predetermined frequency, namely a frequency corresponding to the frequency control value.

In a third embodiment of the driver circuit of the invention, it is provided that the amplitude control is adapted in the case of a too high magnitude of the measurement voltage to calculate a next amplitude control value, such that the amplitude control value is less than a preceding amplitude control value.

In a fourth embodiment of the driver circuit of the invention, it is provided that the amplitude control is adapted so to ascertain the indicator value that such signals whether the magnitude of the measurement voltage applied on the voltage measurement input is too low, namely whether the magnitude has at least subceeded the threshold value.

In a fifth embodiment of the driver circuit of the invention, it is provided that the amplitude control is adapted so to calculate amplitude control values that in the case of a too low magnitude of the measurement voltage sequentially following amplitude control values of the amplitude control sequence are increased, for example, successively.

In a sixth embodiment of the driver circuit of the invention, it is provided that the amplitude control is adapted to calculate an amplitude deviation weighted with the indicator value, in such a manner that the weighted amplitude deviation in the case of too high measurement voltage is less than the amplitude deviation.

In a seventh embodiment of the driver circuit of the invention, it is provided that the amplitude control is adapted to calculate an amplitude desired value weighted with the indicator value, in such a manner that the weighted amplitude desired value in the case of too high measurement voltage is less than the amplitude desired value.

In an eighth embodiment of the driver circuit of the invention, it is provided that the amplitude control is adapted to ascertain, by what amount the measurement voltage is too high, i.e. to quantify an extent, by which the measurement voltage is too high.

In a ninth embodiment of the driver circuit of the invention, it is provided that the amplitude control is adapted so to ascertain the indicator value that the indicator value quantifies an extent, by which the measurement voltage is too high.

In a tenth embodiment of the driver circuit of the invention, it is provided that the amplitude control includes a first comparator having a non inverting-voltage input and an inverting voltage input, wherein the voltage measurement input of the amplitude control is formed by means of the non inverting-voltage input, and wherein a first reference voltage is placed on the inverting voltage input. Developing this embodiment of the invention, it is, furthermore, provided that the amplitude control includes a second comparator having a non inverting-voltage input and an inverting voltage input, wherein the voltage measurement input of the amplitude control is formed by means of the inverting voltage input and wherein a second reference voltage deviating from the first reference voltage is placed on the non inverting-voltage input.

In a first embodiment of the transmitter electronics of the invention, is provided that the load circuit includes a coil.

In a second embodiment of the transmitter electronics of the invention, is provided that the load circuit includes a resistance element, especially one serving for limiting the load current to an electrical current level guaranteeing intrinsic safety of the load circuit and/or of the transmitter electronics.

In a first further development of the transmitter electronics of the invention, such further comprises a two-conductor connection circuit for connecting the transmitter electronics to an evaluation- and supply unit remote therefrom.

In a first embodiment of the first further development of the transmitter electronics, the two-conductor connection circuit is adapted to draw from the evaluation- and supply unit, for example, via a (4 mA to 20 mA-) electrical current loop, electrical power required for operation of the driver circuit.

In a second embodiment of the first further development of the transmitter electronics, the two-conductor connection circuit is adapted to transmit measurement data generated by means of the measurement—and control circuit to the evaluation- and supply unit, especially by modulation of an electrical current flowing in the two-conductor connection circuit and/or serving for providing electrical power for the driver circuit and/or the measurement—and control circuit.

In a second further development of the transmitter electronics of the invention, such further comprises a measurement—and control circuit having a measurement signal input, a, for example, digital, frequency output and a, for example, digital, amplitude output.

In a first embodiment of the second further development of the transmitter electronics, the measurement circuit is adapted to ascertain from an input signal applied on the measurement signal input both a signal frequency as well as also a signal amplitude, In a second embodiment of the second further development of the transmitter electronics, the measurement—and control circuit is, furthermore, adapted to output on the amplitude output an amplitude sequence, namely a sequence of amplitude values ascertained based on the input signal, for example, amplitude values quantifying the signal amplitude of the input signal and/or digital amplitude values, and on the frequency output a frequency sequence, namely a sequence of frequency values ascertained based on the input signal, for example, frequency values quantifying a signal frequency to be set for the input signal and/or digital frequency values.

In an embodiment of the measurement system of the invention, it is provided that the frequency output of the measurement—and control circuit is electrically connected with the frequency control input of the signal generator of the driver circuit, in such a manner that the frequency control value applied on its frequency control input corresponds to a frequency value of the frequency sequence, that the amplitude output of the measurement—and control circuit is electrically connected with the amplitude input of the amplitude control of the driver circuit, in such a manner that the amplitude—actual value on its amplitude input corresponds to an amplitude value of the amplitude sequence and that the measurement transducer is electrically coupled with the measurement signal input of the measurement—and control circuit, in such a manner that the measurement—and control circuit receives the at least one measurement signal and that both the frequency—as well as also the amplitude sequence are dependent on the measurement signal. Developing this embodiment of the invention, it is, furthermore, provided that the measurement transducer is coupled electrically and/or electromagnetically with the load circuit, in such a manner that behavior of the measurement signal as a function of time is dependent on behavior of the load current and/or the load voltage as a function of time, for example, in such a manner that a signal frequency of the measurement signal is dependent on a frequency of the load current, or a frequency of the load voltage and/or in such a manner that a signal amplitude of the measurement signal is dependent on the electrical current level of the load current and/or the voltage level of the load voltage and/or that the measurement transducer has a measuring tube, for example, a measuring tube mechanically connected with a magnet interacting with a coil of the load circuit, wherein the measuring tube is adapted to convey a fluid measured material, for example, to be flowed through by a fluid measured material and during that to be caused to vibrate, for instance that the measurement transducer has a permanent magnet, which interacts with a coil integrated in the load circuit. Alternatively or supplementally, the measurement—and control circuit can, furthermore, be adapted based on the measurement signal to ascertain digital and/or analog measured values representing the at least one physical, measured variable.

In another development of the measurement system of the invention, such further comprises an evaluation- and supply unit, especially an evaluation- and supply unit remote from the transmitter electronics, wherein the transmitter electronics is connected to the evaluation- and supply unit.

In a first embodiment of a further development of the measurement system, it is provided that the transmitter electronics draws electrical power from the evaluation- and supply unit required for operation of the driver circuit.

In a second embodiment of a further development of the measurement system, it is provided that the transmitter electronics transmits measurement data generated by means of the measurement—and control circuit, for example, mass flow-measured values representing a mass flow rate of a medium flowing in a pipe, tube or pipeline, density-measured values representing a density of a medium, or viscosity-measured values representing a viscosity of a medium, to the evaluation- and supply unit, for example, by modulation of an electrical current flowing in a two-conductor connection circuit provided in the transmitter electronics.

A basic idea of the invention is very quickly to detect an impending or actually occurring overload situation for the driver circuit and a distortion of the load current indirectly, namely based on an exceeding of correspondingly predetermined threshold values by the load voltage experienced in such case, which, in given cases, may still not be distorted. As soon as the magnitude of the load voltage is detected as too high, a sinking of the amplitude control value for the signal generator can, in very simple, equally as well effective manner, bring the driver circuit back into a linear working range. An advantage of the invention is that the detection of the overload situation can, on the one hand, be implemented very cost effectively and, on the other hand, with very small need for additional electrical power. A further advantage of the invention, is, however, also that the detection of the invention of overload situations in driver circuits can also be retrofitted into established circuit concepts. In the case of vibronic measuring systems, for example, this can also occur while largely maintaining the amplitude control preceding the driver circuit for the mechanical oscillations.

BRIEF DESCRIPTION OF THE DRAWINGS

The invention as well as other advantageous embodiments thereof will now be explained in greater detail based on examples of embodiments shown in the figures of the drawing. Equal parts are provided in all figures with equal reference characters; when perspicuity requires or it otherwise appears sensible, already presented reference characters are omitted in subsequent figures. Other advantageous embodiments or further developments, especially also combinations of, firstly, only individually explained aspects the invention, result, furthermore, from the figures of the drawing, as well as also the dependent claims per se.

The figures of the drawing show as follows.

DETAILED DISCUSSION IN CONJUNCTION WITH THE DRAWINGS

Figure 1:
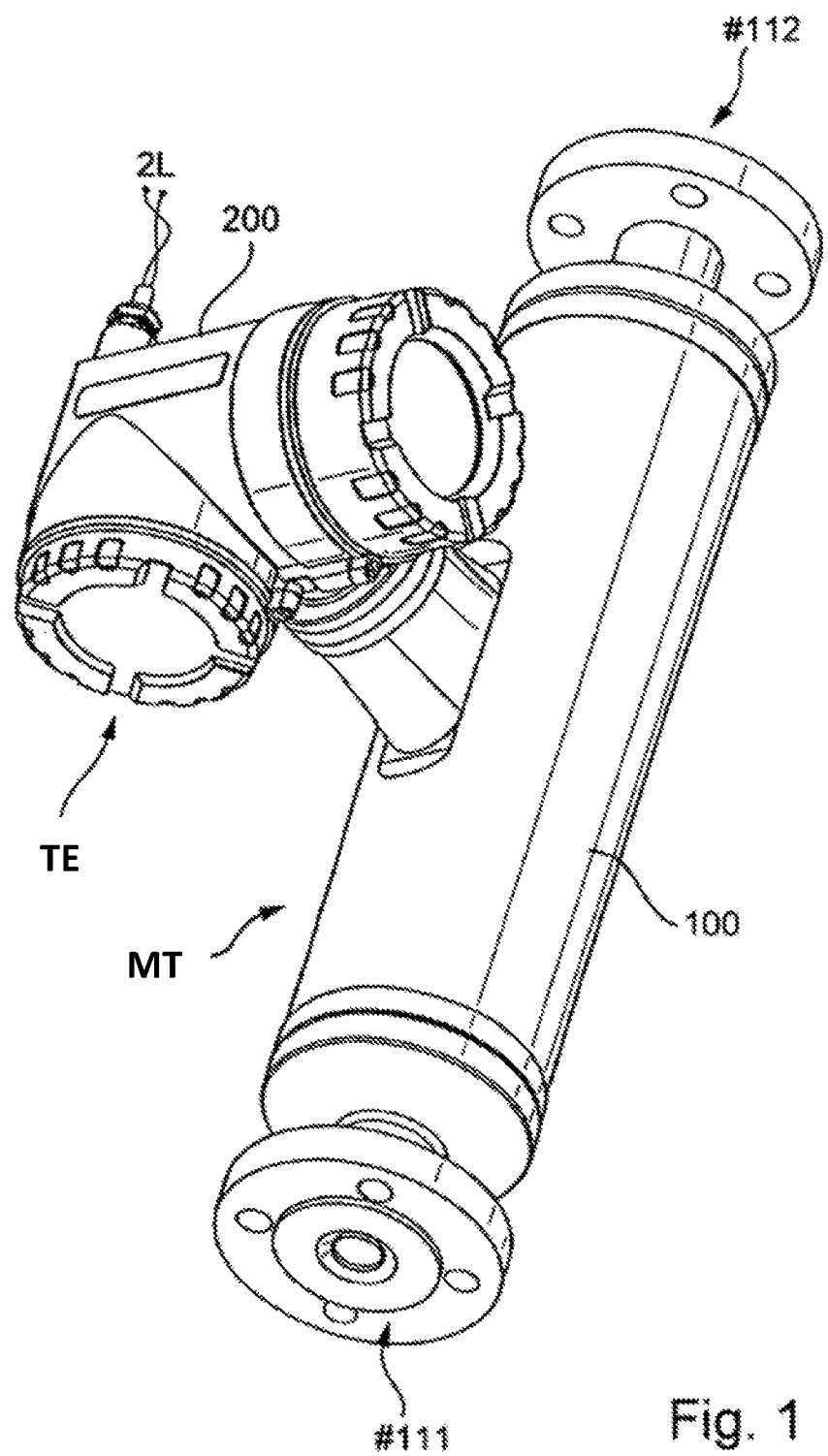
FIG. 1 is a measuring system—here embodied as a compact measuring device—for media flowing in pipelines.
Figure 2:
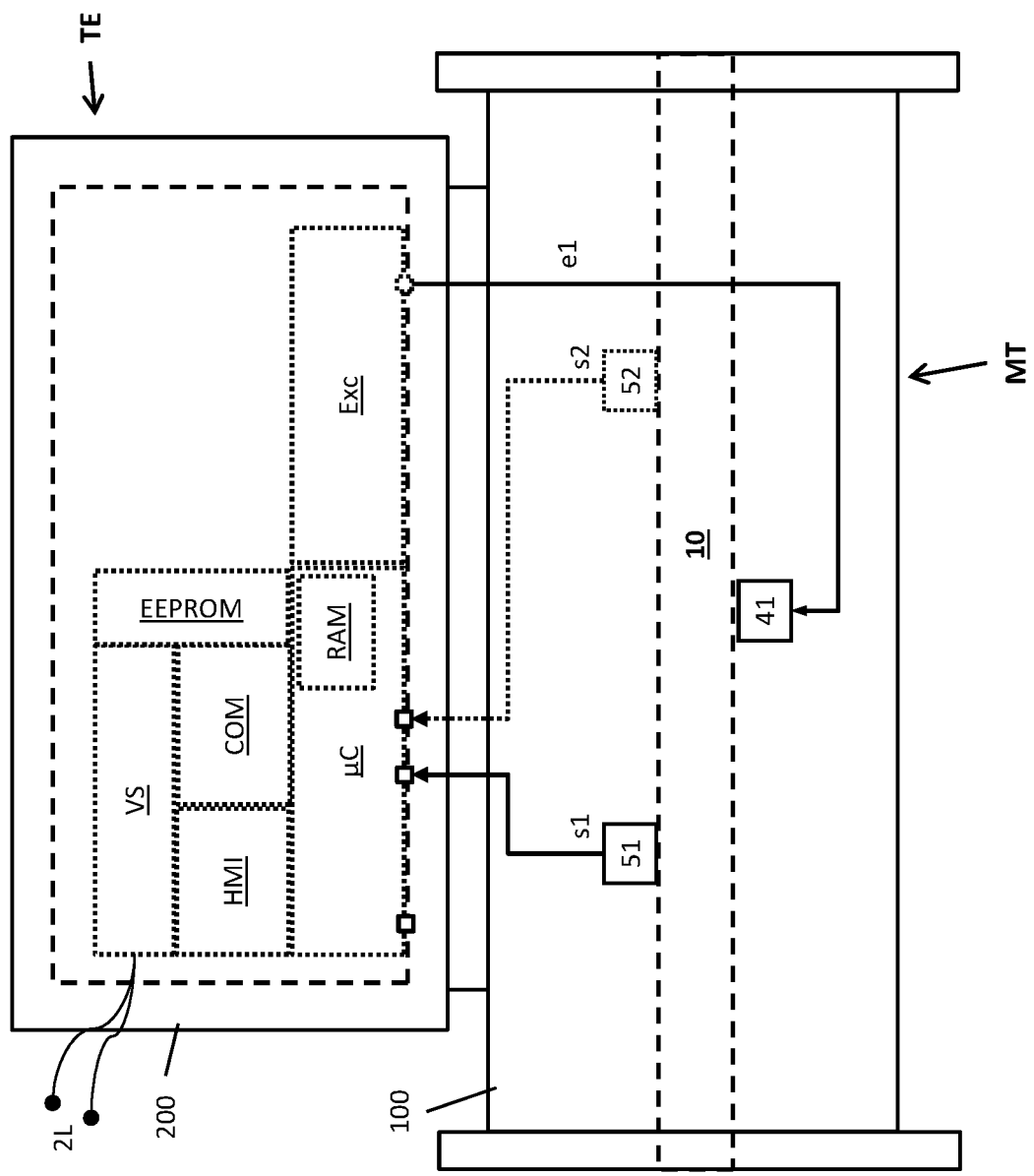
FIG. 2 shows schematically in the manner of a block diagram, an embodiment of a measuring system of FIG. 1 having a transmitter electronics and an active measuring transducer connected thereto.

Shown in FIGS. 1 and 2 is a measuring system for flowable, especially fluid, respectively bulk good, media. The measuring system is insertable into a process line (not shown), for instance, a pipeline of an industrial plant, and formed, for example, by means of a Coriolis-mass flow measuring device, density measuring device, viscosity measuring device or the like. In the example of an embodiment shown here, the measuring system serves for measuring and/or monitoring at least one additional physical, measured variable of a medium guided in the pipeline, i.e. a medium allowed to flow, such as, for instance, a measured variable in the form of a mass flow rate, a density, a viscosity or the like. The measuring system—implemented here by means of an inline measuring device in compact construction—comprises a physical-electrical measuring transducer MT connected to the process line via an inlet end #111 as well as an outlet end #112. Measuring transducer MT is connected to transmitter electronics TE of the measuring system, especially a transmitter electronics supplied during operation with electrical energy from the exterior via connection cable and/or by means of internal energy storer. In an embodiment of the invention, the measurement transducer is especially adapted so to register the at least one physical, measured variable and to transduce such into the corresponding, for example, electrical, measurement signal, in such a manner that the measurement signal follows a change of the physical, measured variable with a change of at least one signal parameter, for example, a signal amplitude, a signal frequency and/or a phase angle. For such purpose, in an additional embodiment of the invention, a sensor arrangement formed, for example, by means of at least one sensor 51 or, as well as also indicated in FIG. 2, by means of an additional (second) sensor 52, for example, one embodied equally to the sensor 51, is provided in the measurement transducer. The at least one sensor 51 can be, for example, an electrodynamic oscillation sensor having, for example, at least one coil $L_{sens}$ for registering mechanical oscillations of the measurement transducer, such that the measurement signals s1, s2 delivered from the sensor arrangement can, accordingly, be oscillation measurement signals.

The measuring transducer MT is, moreover, an active measuring transducer correspondingly converting an electrical, for example, bipolar and/or at least at times periodic, driver signal e1, and its electrical signal power—here delivered by the transmitter electronics TE—by means of an actuator 41, for example, an electro-mechanical, electroacoustic or electro-magnetic exciter, into a measurable effect—such as, for instance, Coriolis forces or electrical voltages induced in the medium—serving for registering the measured variable. The measuring transducer MT can, accordingly, be, for example, a flow measuring transducer flowed through during operation correspondingly by the medium to be measured, such as, for instance, a liquid and/or a gas, such as, for instance, a measuring transducer of vibration-type having a measuring tube and adapted to convey a fluid measured material, especially to be flowed through by a fluid measured material and during that to be caused to vibrate, and having an electro-mechanical oscillation exciter acting thereon, a magneto inductive measuring transducer for conductive liquids or an ultrasonic, measuring transducer for fluids having at least one acoustic transmitter, or, however, for example, also an HF transmitting-/receiving transducer for electromagnetic microwaves, working according to the echo principle. For the case, in which the measuring transducer MT is one of vibration-type for flowing media, it is, furthermore, provided in an embodiment of the invention that the measuring transducer has at least one measuring tube 10 excited by means of the actuator 41, for example, an actuator in the form of an electrodynamic oscillation exciter and/or in the form of a plunging armature-coil arrangement ($L_{exc}$), consequently thus, an inductive actuator, to execute mechanical oscillations. Serving as oscillations can be, for example, such, which have as a result of Coriolis forces in the medium flowing through the measuring transducer an oscillation form dependent on an instantaneous mass flow rate and/or a wanted frequency dependent on an instantaneous density of the medium guided in the measuring transducer and/or a damping dependent on an instantaneous viscosity of the medium guided in the measuring transducer. The measuring tube 10 can—, as well as also indicated in FIG. 2, or directly evident from a combination of FIGS. 1 and 2—be accommodated together with the actuator 41, and, in given cases, additional components of the measuring transducer, within a measuring transducer-housing 100.

In advantageous manner, then, especially programmable and/or remotely parameterable, transmitter electronics ME can, furthermore, be so designed that it can during operation of the measurement system exchange with an electronic data processing system (not shown), for example, a programmable logic controller (PLC), a personal computer and/or a work station, superordinated to the transmitter electronics via a data transmission system, for example, a fieldbus system and/or wirelessly per radio, measuring—and/or other operating data, such as, for instance, current measured values or tuning- and/or diagnostic values serving for control of the measurement system. In such case, the transmitter electronics TE can have, for example, such a connection circuit, which during operation is fed power from a (central) evaluation- and supply unit provided in the above described data processing system remote from the measurement system. For example, the transmitter electronics TE can, in such case, furthermore, be so embodied that it is electrically connectable with the external electronic data processing system via a two-conductor connection 2L configured, for example, as a 4-20 mA-electrical current loop, and can be supplied with electrical energy thereby as well as transmit measured values to the data processing system. The transmitter electronics TE can have, furthermore, for connecting the transmitter electronics to the two-conductor connection 2L a two-conductor connection circuit, via which the transmitter electronics TE draws the electrical power required for its operation from the above described evaluation- and supply unit, for instance, in the form of a direct current supplied from the evaluation- and supply unit via a (4 mA to 20 mA-) electrical current loop and a terminal voltage corresponding therewith at an input of the two-conductor connection circuit, and via which the transmitter electronics during operation transmits generated measurement data, and -values, to the evaluation- and supply unit, for example, by (load-)modulation of the supplied direct current.

Figure 3:
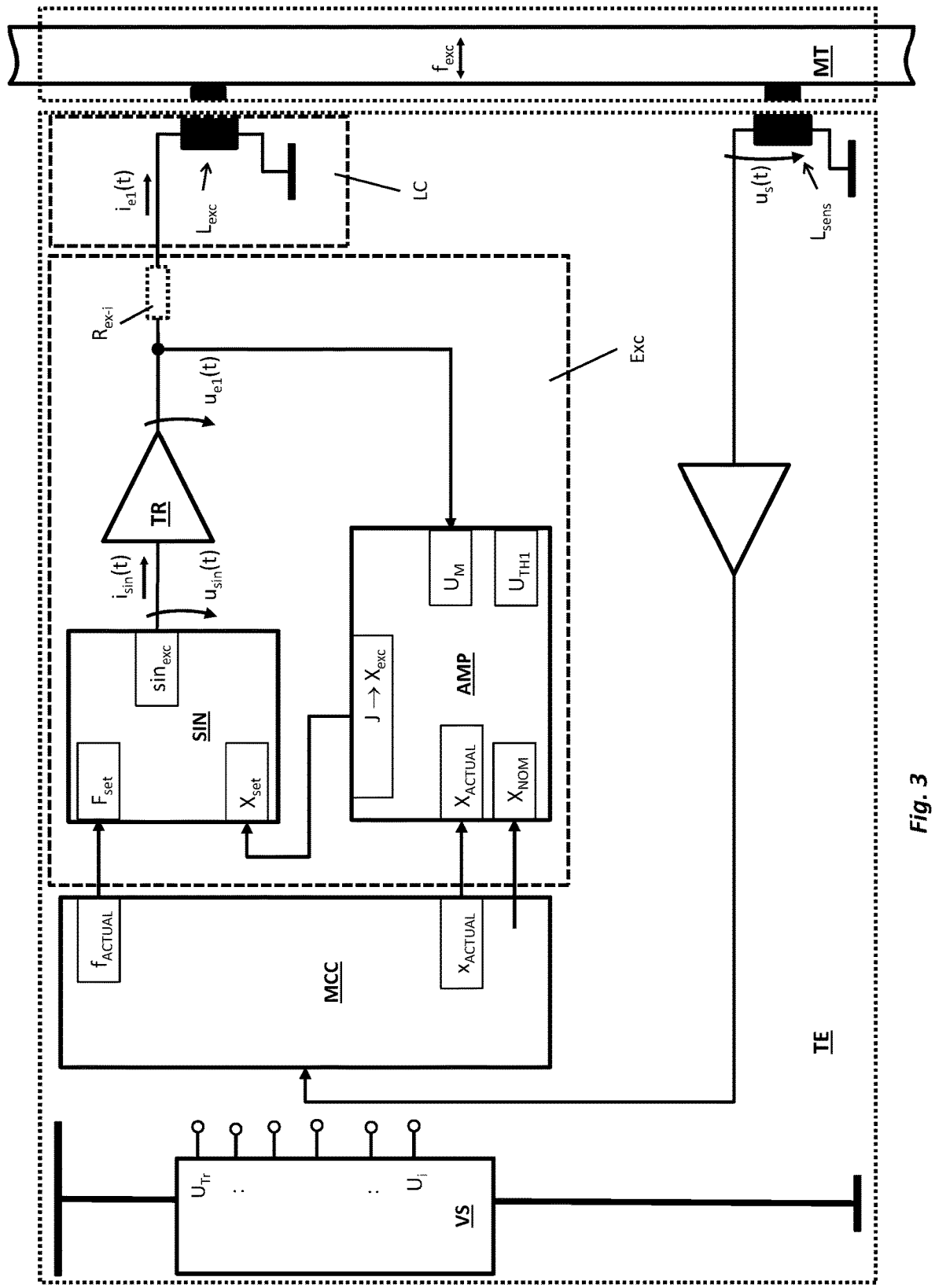
FIG. 3 shows schematically in the manner of a block diagram, a driver circuit suitable for a transmitter electronics of FIG. 2, consequently a measuring system of FIG. 1, for an active measuring transducer—here a measuring transducer formed as a measuring transducer of vibration-type with at least one oscillating measuring tube.
Figure 4:
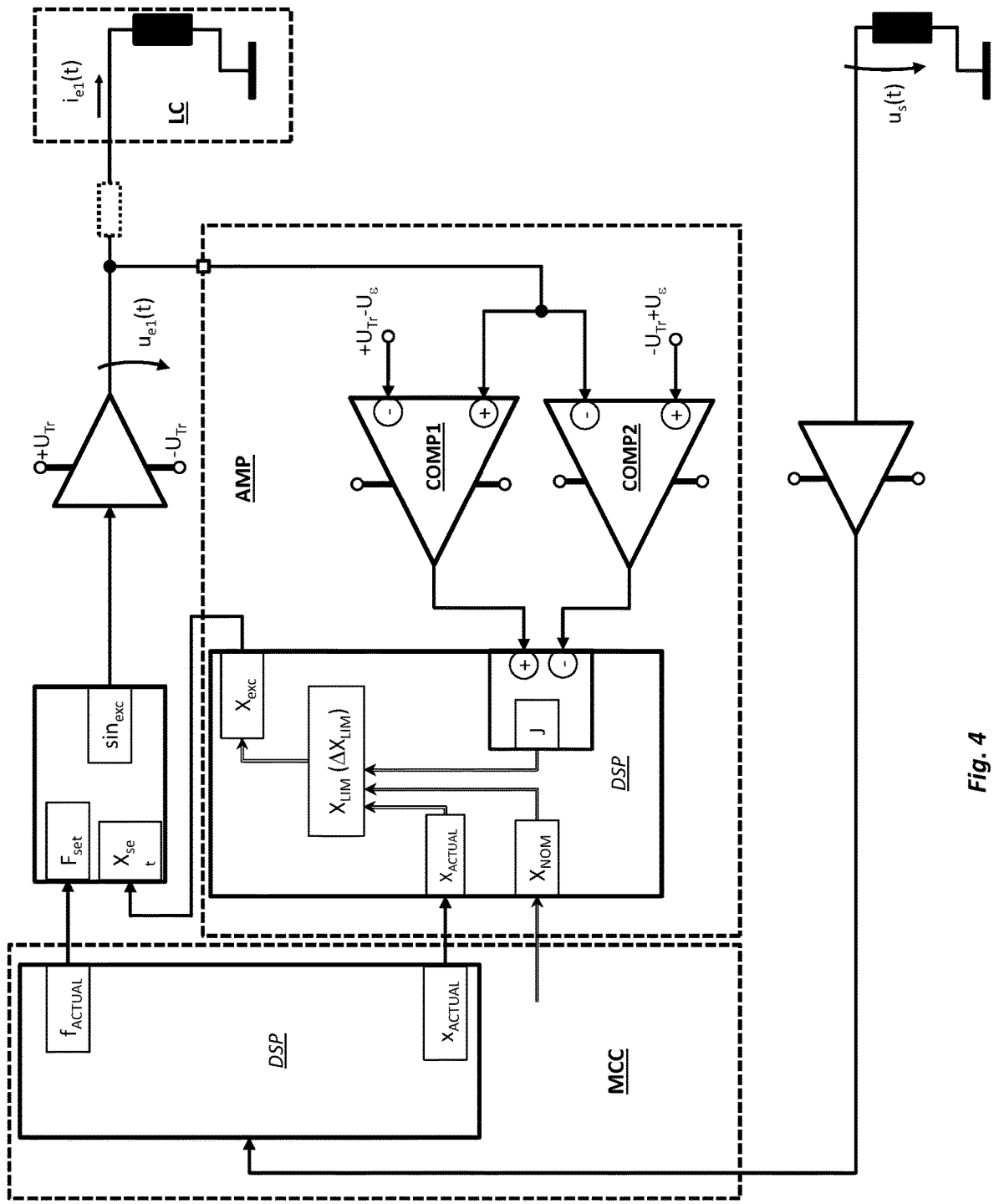
FIG. 4 shows schematically in the manner of a block diagram, an embodiment of a driver circuit of FIG. 3.

For operating the measuring transducer, the transmitter electronics TE, for example, also the intrinsically safe transmitter electronics and/or a transmitter electronics nominally operated with a maximum power of 1 W or less, includes, as shown schematically in FIGS. 2, 3, and 4 in the manner of a block diagram, furthermore, a driver circuit Exc serving especially for generating the above described driver signal e1 for operating the actuator 41. The driver circuit Exc is in an additional embodiment of the invention, furthermore, electrically connected with a load circuit LC provided in the transmitter electronics TE—here namely a load circuit formed as a component of the above described actuator 41 of a physical to electrical-measuring transducer and/or formed by means of at least one coil $L_{exc}$. In an additional embodiment of the invention, as well as also indicated in FIGS. 3, and 4, in each case, a resistance element $R_{ex-i}$ is, furthermore, provided in the load circuit, serving especially for limiting the load current to an electrical current level guaranteeing intrinsic safety of the load circuit, and the transmitter electronics formed therewith.

The driver circuit Exc comprises, as shown schematically in FIGS. 3 and 4, a signal generator SIN, for example, one formed by means of a digital signal processor and/or by means of a digital-to-analog converter. Signal generator SIN has a frequency control input ($f_{set}$), an amplitude control input ($X_{set}$) and a signal output ($\sin_{exc}$). Signal generator SIN is adapted to output on its signal output an at least at times periodic, for example, also at least at times harmonic, electrical, analog signal $u_{sin}(t)$ having a signal frequency ($f_{exc}$) predetermined by a—digital or, in given cases, also analog—frequency control value $f_{set}$ applied on the frequency control input and a voltage- and/or electrical current amplitude predetermined by a—digital or, in given cases, also analog—amplitude control value $X_{set}$ applied on the amplitude control input. For the above described case, in which the measuring transducer MT is of vibration-type, the frequency control value $f_{set}$ can correspond ($f_{set} \leftarrow f_{exc}$), for example, to a mechanical resonant frequency of the at least one measuring tube 10 to be excited by means of the driver circuit Exc, and serving, consequently, as the above-mentioned wanted frequency. Furthermore, the driver circuit includes an end stage TR operated by means of a direct voltage $U_{Tr}$, for example, a bipolar direct voltage, with a signal input, especially a high resistance signal input and/or a signal input having an input resistance greater than 0.5 MΩ, and with a load output. The direct voltage $U_{Tr}$ can, additionally, be, for example, also the operating- and/or reference voltage of the mentioned digital-to-analog converter of the signal generator SIN. The end stage TR is, especially, adapted to drive through an electrical circuit involving the load output a load current $i_{e1}(t)$ having a electrical current level dependent on a signal voltage and/or a signal current of an electrical input signal, for example, a bipolar and/or at least an at times periodic input signal, applied on the signal input, as well as to provide on the load output a load voltage $u_{e1}(t)$ having a voltage level dependent on the electrical current level of the load current $i_{e1}(t)$. In other words, end stage TR thus, serves to convert the electrical input- or even control signal applied on its signal input into a corresponding electrical output signal ($e_1$) on the load output, namely to amplify the input signal, so that the output signal corresponding therewith, in given cases, corresponding only to an amplitude modulation of the input signal, has an electrical power, which is higher than an electrical power of the input signal but otherwise essentially corresponding to the input signal as a function of time. As evident from FIG. 3, in the case of the driver circuit of the invention, the signal input of the end stage TR is electrically connected with the signal output of the signal generator SIN, so that the electrical current level of the load current $i_e(t)$ output from the end stage is dependent on the voltage $u_{sin}(t)$ and/or the electrical current $i_{sin}(t)$ of the electrical, analog signal output from the signal generator SIN, and the analog signal output from the signal generator is amplified by means of the end stage TR and converted into the output signal output on the load output. For the case shown in FIGS. 3 and 4, in which the load output and the actuator 41 of the measuring transducer are electrically connected with one another, the output signal output on the load output can then, thus, serve as the aforementioned driver signal e1. For such purpose, in an additional embodiment of the invention, the load output of the end stage is electrically connected with the load circuit LC, in such a manner that the load voltage falls across the load circuit. The load voltage $u_e(t)$ can, for example, be so embodied that it has, at least at times, a periodic behavior, especially in such a manner that the load voltage $u_e(t)$ changes over a time period of at least two periods with a predetermined frequency ($f_{exc}$), namely a frequency corresponding to the frequency control value $f_{set}$. For setting the electrical current level of the load current ie(t), for example, to its peak value or to its effective value, and the voltage level of the load voltage $u_e(t)$, for example, to its peak value or to its effective value, to, in each case, correspondingly predetermined desired values, and for tuning an amplitude of the driver signal e1, the driver circuit Exc of the invention includes, furthermore, an amplitude control AMP—, for example, one at least partially formed by means of the above described microprocessor and/or by means of the above described signal processor—with a—digital or analog—amplitude input and with a—digital or analog—amplitude output.

The amplitude control AMP of the driver circuit Exc of the invention is, additionally, adapted, recurringly, to ascertain an amplitude deviation ΔX, namely a—relative or absolute—deviation between an amplitude-actual value $X_{actual}$ presiding on the amplitude input and an amplitude desired value $X_{NOM}$—here representing a nominal amplitude, namely an amplitude predetermined for a normal, undisturbed operation of the driver circuit Exc—($|X_{ACTUAL} - X_{NOM}| \rightarrow \Delta X$, $|X_{ACTUAL} - X_{NOM}|/X_{NOM} \rightarrow \Delta X$). The amplitude desired value $X_{NOM}$ can, for example, be provided directly in the amplitude control AMP and/or, as well as also indicated in FIG. 3, be forwarded during operation from the measurement—and control circuit to the amplitude control. Moreover, the amplitude control is AMP adapted, recurringly, to ascertain an amplitude control value $X_{exc}$—here representing an instantaneously to be controlled, or by means of the end stage actually controllable, amplitude of the analog signal, for example, an actually controllable maximum voltage (peak value),—, for example, to calculate such based on the above described amplitude deviation ΔX, as well as to output on the amplitude output an amplitude control sequence, namely a sequence of time sequentially calculated amplitude control values. The amplitude output of the amplitude control is, in turn, electrically connected with the amplitude control input of the signal generator, in such a manner that the voltage- and/or electrical current amplitudes of the analog signal are specified by amplitude control values ($X_{set}$) of the amplitude control sequence applied on the amplitude control input.

In the case of the measuring system of the invention, the above-mentioned measuring transducer MT can be coupled, for example, electrically and/or electromagnetically—with the load circuit, in such a manner that a behavior of the measurement signal as a function of time depends on the load current $i_e(t)$ and/or the load voltage as a function of time, for instance, in such a manner that a signal frequency of the measurement signal depends on a frequency of the load current, or the load voltage $u_e(t)$ and/or that a signal amplitude of the measurement signal s1 depends on the electrical current level of the load current $i_e(t)$ and/or the voltage level $u_e(t)$ of the load voltage. Particularly for the above described case, in which the measuring transducer is a measuring transducer of vibration-type, additionally, a magnet connected mechanically with the measuring tube 10 can interact with a coil $L_{exc}$ integrated in the load circuit LC, namely be electromagnetically coupled with such. The magnet can be, for example, especially a rod-shaped or pot shaped, permanent magnet.

For processing measurement signals delivered from the measuring transducer, the transmitter electronics of an additional embodiment of the invention includes, furthermore, a measurement—and control circuit MCC. The measurement—and control circuit MCC as shown schematically in FIG. 3 is electrically connected with measuring transducer MT, i.e. its sensor arrangement 51 (or 51, 52) and, especially, adapted based on the at least one measurement signal s1 of the measuring transducer MT during operation to ascertain measured values representing the at least one measured variable, such as e.g. a mass flow rate, and correspondingly to output such, for example, in the form of digital values. The measurement signals s1, s2 generated by the measuring transducer—, for example, in each case, formed as an oscillation measurement signal—, which in the case of a measuring transducer of vibration-type have, in each case, a signal component with a signal frequency corresponding to an instantaneous oscillation frequency of the at least one $f_{exc}$ oscillating measuring ng measuring tube, amounting for example, to between 100 Hz (=hertz) and 2 kHz, are, as well as also shown in FIG. 2, fed to the transmitter electronics TE, thus to the therein provided measurement—and control circuit MCC, where they are, firstly, preprocessed, for example, preamplified, filtered and digitized, by means of a corresponding input circuit, in order then to be able to be suitably evaluated. In an additional embodiment of the invention, measurement—and control circuit MCC includes, accordingly, at least one measurement signal input and the measurement circuit is, furthermore, adapted to ascertain from an input signal applied on the measurement signal input both a signal frequency as well as also a signal amplitude. Moreover, measurement—and control circuit MCC includes, as well as also shown in FIGS. 3 and 4, in each case, a—digital or analog—frequency output as well as a—digital or analog—amplitude output. Additionally, the measurement—and control circuit MCC is also adapted to output on the amplitude output an amplitude sequence, namely a sequence of amplitude values $X_{set}$ ascertained based on the input signal, for example, amplitude values $X_{set}$ quantifying the signal amplitude of the input signal and/or digital amplitude values $X_{set}$ and on the frequency output a frequency sequence, namely a sequence of frequency values $f_{ACTUAL}$ ascertained based on the input signal, for example, frequency values $f_{ACTUAL}$ quantifying a signal frequency to be set for the input signal and/or digital frequency values $f_{ACTUAL}$. In an additional embodiment of the invention, it is, furthermore, provided that the frequency output of the measurement—and control circuit MCC is electrically connected with the frequency control input of the signal generator SIN of the driver circuit Exc, in such a manner that the frequency control value $F_{set}$ applied on its frequency control input corresponds to a frequency value $f_{ACTUAL}$ of the frequency sequence. Moreover, the amplitude output of the measurement—and control circuit MCC can, additionally, be electrically connected with the amplitude input of the amplitude control AMP of the driver circuit Exc, in such a manner that the amplitude-actual value $X_{ACTUAL}$ present on its amplitude input corresponds to an amplitude value $X_{ACTUAL}$ of the amplitude sequence.

In an additional embodiment of the invention, the measuring transducer is, additionally, electrically coupled with the measurement signal input of the measurement—and control circuit, in such a manner that the measurement—and control circuit receives the at least one measurement signal and that both the frequency—as well as also the amplitude sequence depend on the measurement signal. For the above described case, in which the measuring transducer is of vibration-type, the frequency values of the frequency sequence can, such as mentioned above, correspond to an oscillation frequency of oscillations of the at least one measuring tube, in each case, to be set by means of the driver signal e1 generated by the driver circuit Exc, for example, a resonant frequency to be excited for the at least one measuring tube, and the amplitude values of the amplitude sequence can correspond to a oscillation amplitude of oscillations of the at least one measuring tube to be set, in each case, by means of the driver signal. In an additional embodiment of the invention, the measurement—and control circuit is, furthermore, adapted based on the measurement signal to ascertain—analog and/or digital—measured values representing the at least one physical measured variable.

In an additional embodiment of the invention, the measurement—and control circuit MCC is provided by means of a microcomputer in the transmitter electronics TE, for example, implemented by means of a digital signal processor DSP, and by means of program-code running therein. The program-code can be stored persistently e.g. in a non-volatile data memory EEPROM of the microcomputer and in the case of starting of the same be loaded into volatile data memory RAM, e.g. integrated in the microcomputer. Of course, the measurement signals are, such as just indicated, to be converted into corresponding digital signals by means of a corresponding analog-to-digital converter (A/D converter) of the transmitter electronics ME for processing in the microcomputer; compare, in this regard, for example, the above cited U.S. Pat. No. 6,311,136 or US-A 2011/0271756. The measurement—and control circuit MCC can communicate during operation besides with the measuring transducer, for example, additionally, with the driver-circuit Exc, for example, in order correspondingly to take into consideration amplitude control values ($X_{exc}$) generated therewith in the case of calculating the measured values.

The driver circuit Exc and the above-mentioned measurement—and control circuit MCC as well as other electronic components of the transmitter electronics TE serving for operation of the measurement system, such as, for instance, an internal energy supply circuit VS for providing internal supply direct voltages and/or a transmitting- and receiving circuit COM serving for communication with a superordinated measurement data processing system, or over an external fieldbus, can—, as well as also directly evident from a combination of FIGS. 1 and 2—, for example, be accommodated in a corresponding electronics housing 200, especially an impact- and/or even explosion-resistantly and/or hermetically sealed electronics housing 200. For visualizing measuring system internally produced measured values and/or, in given cases, measuring system internally generated status reports, such as, for instance, an error report or an alarm, on-site, the measurement system can, furthermore, have a display- and servicing element HMI communicating at least at times with the measurement—and control circuit, such as, for instance, an LCD-, OLED- or TFT-display placed in the aforementioned electronics housing 200 behind a window correspondingly provided therein as well as a corresponding input keypad and/or a touch screen. The electrical connecting of the measuring transducer MT to the transmitter electronics TE can occur by means of corresponding connecting lines, for example, via electrical cable, which leads from the electronics-housing 200. The connecting lines can, in such case, be embodied, at least partially, as electrical line wires surrounded, at least sectionally, by electrical insulation, e.g. in the form of "twisted-pair" lines, flat ribbon cables and/or coaxial cables. Alternatively thereto or in supplementation thereof, the connecting lines can at least sectionally also be formed by means of conductive traces of an, especially flexible, in given cases, lacquered circuit board.

Figure 5:
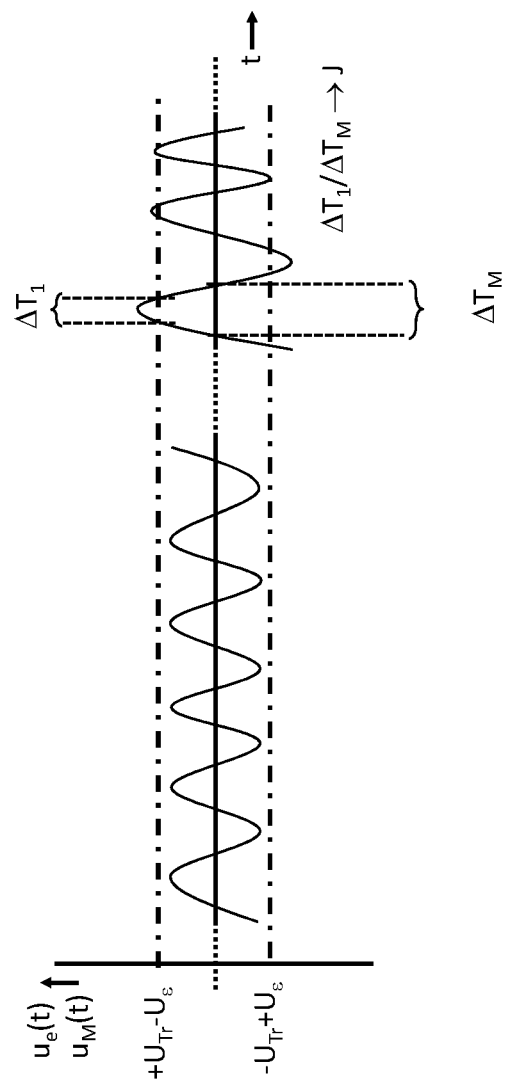
FIG. 5 shows as a function of time, a (measuring-)voltage detectable in a driver circuit of FIG. 3, or 4.

As indicated above, in the case of measuring systems of the type being discussed, not least of all also in the case of two-conductor field devices, and vibronic measuring systems, an accuracy of measurement, with which the measured values for the at least one measured variable are ascertained, can depend on whether the driver circuit operates within a predetermined working range, consequently not or, at most, only for a short time is overloaded. Especially, also those overload situations, in the case of which overdriving of the end stage occurs during measuring, are to be prevented, in order to assure that the output load current $i_e(t)$, and the output load voltage $u_e(t)$, are not distorted in comparison with the analog signal lying on the input, consequently in order to assure that the so formed driver signal e1, and the corresponding exciting of the measuring transducer, actually correspond to the specifications stored in the measurement—and control circuit and transmitted to the signal generator. For example, a course of the load voltage $u_e(t)$ corresponding to that shown in FIG. 5 as a function of time is to be prevented or should at least be allowed, as well as also indicated in FIG. 5, at most, only for a short time. For registering an impending or actually arisen overload situation of the driver circuit Exc, for example, an overdriving of the end stage TR, the amplitude control of the driver circuit of the invention includes, furthermore, an especially high resistance voltage measurement input ($U_M$), especially one having an input resistance greater than 0.5 MΩ (=megaohm). Additionally, the amplitude control is, especially, also adapted, recurringly, to ascertain an indicator value J, which signals whether a magnitude $|u_M(t)|=U_M$ of a measurement voltage $u_M(t)$ applied on the voltage measurement input is too high, namely whether the magnitude $|u_M(t)|=U_M$ exceeds a predetermined threshold value $U_{TH1}$ ($U_M \overset{?}{>} U_{TH1}$). In an additional embodiment of the invention, the amplitude control AMP is, furthermore, also adapted in the case of a too high magnitude $U_M$ of the measurement voltage $u_M$, then to calculate a next amplitude control value such that the amplitude control value is less than its preceding amplitude control value.

In another embodiment of the invention, the amplitude control is, additionally, adapted to ascertain, by what amount the measurement voltage is too high, thus, to quantify an extent, by which the measurement voltage is too high, for example, to ascertain by how much a magnitude of a voltage amplitude of the measurement voltage lies above the threshold value $U_{TH1}$ and/or for how long the magnitude of the measurement voltage within a predetermined time interval lies above the threshold value $U_{TH1}$, and the amplitude control is, additionally, adapted so to ascertain the indicator value J that such quantifies an extent, by which the measurement voltage, thus the load voltage $u_e(t)$, is too high. For example, as well as also indicated in FIG. 5, for the purpose of measuring the indicator value J by means of the amplitude control, a time fraction $\Delta T_1$ can be ascertained, in which the measurement voltage $u_M(t)$, thus the load voltage $u_e(t)$, is, i.e. has been, as a whole, too high in a measurement interval $\Delta T_M$, for example, predetermined with 20 ms (=milliseconds) and/or with greater than an oscillation period of the above described signal frequency $f_{exc}$,—, for example, an earlier, most recent—measurement interval $\Delta T_M$, and, based thereon, the indicator value J can be so generated by the amplitude control AMP that such quantifies the time fraction, for example, relatively, with reference to the measurement interval $\Delta T_M$ ($\Delta T_1/\Delta T_M \rightarrow J$). In an additional embodiment of the invention, it is, consequently, furthermore, provided that the amplitude control AMP calculates the indicator value J based on a formula $J=J_{max} \cdot \Delta T_1/\Delta T_M$, i.e. that the indicator value ascertained by the amplitude control fulfills the formula, wherein $J_{max}$ represents an earlier established, maximum allowable value for the indicator value J, for example, corresponding to the threshold value $U_{TH1}$, i.e. equivalent thereto ($J_{max} \sim U_{TH1}$). The above-mentioned measurement interval $\Delta T_M$ can in advantageous manner, furthermore, be so dimensioned that it fulfills a condition $\Delta T_M \geq f_{exc}^{-1}$, especially also a condition $20 \cdot f_{exc}^{-1} > \Delta T_M \geq f_{exc}^{-1}$.

For the purpose of an as rapid as possible feedback of a load voltage detected as too high in the working range actually predetermined for the driver circuit, the amplitude control AMP can, furthermore, also be adapted to calculate a next, lower, amplitude control value as a function of the ascertained extent to which the measurement voltage $u_M(t)$ is too high, for example, in such a manner that a difference between the next amplitude control value and the preceding amplitude control value is proportional to a difference between the magnitude of the (instantaneously superelevated) measurement voltage $u_M(t)$ and the threshold value $U_{TH1}$. In an additional embodiment of the invention, the amplitude control AMP is, consequently, adapted to calculate, recurringly, an amplitude desired value $X_{LIM}$ ($X_{LIM}=J \cdot X_{NOM}$) weighted with the (current) indicator value J and/or an amplitude deviation $\Delta X_{LIM}$ ($\Delta X_{LIM}=J \cdot \Delta X$) weighted with the indicator value, in such a manner that the weighted amplitude desired value $X_{LIM}$ in the case of too high measurement voltage is less than the amplitude desired value $X_{NOM}$, or that the weighted amplitude deviation $X_{LIM}$ in the case of too high measurement voltage $u_M(t)$ is less than the amplitude deviation $\Delta X$. For the above described case, in which by means of the amplitude control AMP, firstly, the weighted amplitude deviation $\Delta X_{LIM}$ is ascertained, the amplitude control AMP can, furthermore, also be adapted to calculate the amplitude control values based on the weighted amplitude deviation $\Delta X_{LIM}$. For the purpose of calculating the amplitude control values—be it based on the amplitude deviation $\Delta X$ and the indicator value J as input variables or the weighted amplitude deviation $\Delta X_{LIM}$—there can be implemented in the amplitude control AMP, furthermore, a corresponding (digital-) controller, for example, with an at least partially proportional and/or at least partially integrating controller behavior (P-controller, I-controller, or PI-controller).

In an additional embodiment of the invention, the amplitude control is, furthermore, conversely, also adapted so to ascertain the indicator value that such signals whether, in given cases, the magnitude of the measurement voltage applied on the voltage measurement input is too low, namely whether the magnitude has subceeded at least the threshold value $U_{TH1}$ or, in given cases, also a correspondingly predetermined, additional, (second) threshold value $U_{TH2}$—namely one lower in comparison with the (first) threshold value $U_{TH1}$. Alternatively or supplementally, the amplitude control can, additionally, also be adapted so to calculate amplitude control values that, in the case of a too low magnitude $U_M$ of the measurement voltage $u_M(t)$, thus the load voltage $u_e(t)$, sequentially following, amplitude control values of the amplitude control sequence are increased, for example, successively increased.

The above-mentioned threshold value $U_{TH1}$, and, in given cases, the likewise required threshold value $U_{TH2}$, can, for example, be kept in the amplitude control, for example, in the form of a digital default value, or, as well as also indicated in FIGS. 3 and 4, be generated within the amplitude control in the form of an analog default value $U_{TH1}=|+U_{TR}-U_\epsilon|=|-U_{TR}+U_\epsilon|$ by means of comparators based on reference voltages ($+U_{TR}-U_\epsilon$), respectively ($-U_{TR}+U_\epsilon$) appropriately placed on corresponding reference voltage inputs. Moreover, the amplitude control AMP is, furthermore, adapted to calculate, with application of the indicator value J, an amplitude control value especially an amplitude control value serving for lessening, or minimizing, the amplitude deviation and/or a digital, amplitude control value, in such a manner that in the case of a too high magnitude $U_M$ of the measurement voltage $u_M(t)$ sequentially following amplitude control values $X_{exc}$ of the amplitude control sequence are, in given cases, also lessened, for example, successively, in given cases, also with a predetermined, or constant, step difference, in spite of a continuously too high, or further increasing, amplitude deviation $\Delta X$. As shown in FIGS. 3 and 4, in an additional embodiment of the invention, the load output of the end stage TR is electrically connected with the voltage measurement input of the amplitude control AMP, in such a manner that the load voltage $u_e(t)$ lies on the voltage measurement input of the amplitude control, thus serving as measurement voltage $u_M(t)$ to be monitored as regards magnitude ($|u_e(t)| \rightarrow U_M$). By selecting a suitable threshold value $U_{TH1}=|+U_{TR}-U_\epsilon|=|-U_{TR}+U_\epsilon|$, for example, one matched to a dynamic range of the driver circuit Exc, or of a voltage regulator for the load voltage $u_e(t)$ formed by means of the signal generator SIN, the end stage TR as well as the amplitude control AMP, or by corresponding selection of the reference voltages $|+U_{TR}-U_\epsilon|$, $|-U_{TR}+U_\epsilon|$ corresponding, in given cases, to this threshold value, it can in very simple, equally as well effective manner be assured that the end stage TR, and the driver circuit Exc formed therewith, are operated as far as possible only within a stable working range, and that the end stage TR overshoots, at most, only for very short times.

In an additional embodiment of the invention, the amplitude control includes for measuring the indicator value J a first comparator COMP1 with a non inverting-voltage input ("+") and with an inverting voltage input ("−"), wherein—, as well as also shown in FIG. 4—the voltage measurement input of the amplitude control is formed by means of the non inverting-voltage input, and wherein a first reference voltage $(+U_{TR}-U_\epsilon)$ is placed on the inverting voltage input. Moreover, the amplitude control can, additionally, have a second comparator COMP2 with a non inverting-voltage input and with an inverting voltage input, wherein the voltage measurement input of the amplitude control is also formed by means of the inverting voltage input and wherein a second reference voltage $(-U_{TR}+U_\epsilon)$ differing from the first reference voltage $(+U_{TR}-U_\epsilon)$ is placed on the non inverting-voltage input.

The invention claimed is:

1. A driver circuit, comprising:
a signal generator, including,
a frequency control input; an amplitude control input and a signal output;
an end stage, including,
a signal input and a load output;
as well as an amplitude control, including:
an amplitude input,
an amplitude output, and
a voltage measurement input;
wherein:
said signal generator is adapted to output on its signal output an at least at times periodic, harmonic, electrical, analog signal, said analog signal showing a signal frequency predetermined by a frequency control value applied on said frequency control input and said analog signal showing a voltage and/or electrical current amplitude predetermined by an amplitude control value applied on said amplitude control input;
said end stage is adapted to drive through an electrical circuit involving said load output a load current showing an electrical current level dependent on a signal voltage and/or a signal current of an electrical input signal applied on said signal input as well as to provide on said load output a load voltage showing a voltage level dependent on the electrical current level of the load current;
said amplitude control is adapted recurringly to ascertain an amplitude deviation which is a deviation between an amplitude actual value presiding on said amplitude input and an amplitude desired value;
said amplitude control is adapted recurringly to ascertain an indicator value which signals that a magnitude of a measurement voltage applied on the voltage measurement input is too high, if the magnitude has exceeded a threshold value and, with application of said indicator value, to ascertain an amplitude control value in such a manner that in the case of a too high magnitude of the measurement voltage and/or an indicator value signaling a too high magnitude of the measurement voltage sequentially following amplitude control values of the amplitude control sequence are lessened;
and said amplitude control is adapted to output on the amplitude output an amplitude control sequence, which is a sequence of amplitude control values calculated timewise one after the other;
and the signal output of said signal generator is electrically connected with the signal input of the end stage and the load output of the end stage is electrically connected with the voltage measurement input of the amplitude control, in such a manner that the electrical current level of the load current output from the end stage is dependent on the voltage and/or the electrical current of the electrical analog signal output from said signal generator, and that the load voltage lies on the voltage measurement input of the amplitude control; and
the amplitude control output of said amplitude control is electrically connected with the amplitude control input of said signal generator, in such a manner that the voltage and/or electrical current amplitude of the analog signal are/is predetermined by amplitude control values of the amplitude control sequence applied on the amplitude control input.

2. The driver circuit as claimed in claim 1, wherein:
the amplitude control is adapted to ascertain a time fraction, in which the measurement voltage is during a predetermined measurement interval, as a whole, too high; and
the amplitude control is adapted so to ascertain the indicator value that such quantifies the time fraction.

3. The driver circuit as claimed in claim 1, wherein:
the load voltage, thus the measurement voltage applied on the voltage measurement input of the amplitude control, has, at least at times, a periodic behavior.

4. The driver circuit as claimed in claim 1, wherein:
the amplitude control is adapted in the case of a too high magnitude of the measurement voltage to calculate a next amplitude control value such that the amplitude control value is less than a preceding amplitude control value; and/or
the amplitude control is adapted so to ascertain the indicator value that such signals whether the magnitude of the measurement voltage applied on the voltage measurement input is too low if the magnitude has at least subceeded the threshold value; and/or
the amplitude control is adapted so to calculate amplitude control values that in the case of a too low magnitude of the measurement voltage sequentially following amplitude control values of the amplitude control sequence are increased; and/or
the amplitude control is adapted to calculate an amplitude deviation weighted with the indicator value, in such a manner that the weighted amplitude deviation in the case of too high measurement voltage is less than the amplitude deviation; and/or
the amplitude control is adapted to calculate an amplitude desired value weighted with the indicator value, in such a manner that the weighted amplitude desired value in the case of too high measurement voltage is less than the amplitude desired value; and/or the amplitude control is adapted to ascertain, by what amount the measurement voltage is too high, by which the measurement voltage is too high; and/or the amplitude control is adapted so to ascertain the indicator value that the indicator value quantifies an extent, by which the measurement voltage is too high.

5. The driver circuit as claimed in claim 1, wherein:
the amplitude control includes a first comparator having a non-inverting voltage input and an inverting voltage input; and
the voltage measurement input of the amplitude control is formed by means of the non-inverting voltage input, and wherein a first reference voltage is placed on the inverting voltage input.

6. The driver circuit as claimed in claim 5, wherein:
the amplitude control includes a second comparator having a non-inverting voltage input and an inverting voltage input;
the voltage measurement input of the amplitude control is formed by means of the inverting voltage input; and
a second reference voltage deviating from the first reference voltage is placed on the non-inverting voltage input.

7. Transmitter electronics, comprising:
a driver circuit as defined in claim 1;
as well as a load circuit;
wherein
the load output of the end stage is electrically connected both with the voltage measurement input of the amplitude control as well as also with the load circuit, in such a manner that the load voltage is both applied to the voltage measurement input of the amplitude control as well as also falls across the load circuit.

8. The transmitter electronics as claimed in claim 7, wherein:
the load circuit includes a coil; and/or
the load circuit includes a resistance element.

9. The transmitter electronics as claimed in claim 7, further comprising:
a two-conductor connection circuit for connecting the transmitter electronics to an evaluation and supply unit remote therefrom.

10. The transmitter electronics as claimed in claim 9, wherein:
the two-conductor connection circuit is adapted to draw from the evaluation and supply unit electrical power required for operation of the driver circuit.

11. The transmitter electronics as claimed in claim 9, wherein:
the two-conductor connection circuit is adapted to transmit measurement data generated by means of the measurement and control circuit to the evaluation and supply unit.

12. The transmitter electronics as claimed in claim 9, further comprising:
a measurement and control circuit including: a measurement signal input, a frequency output wherein:
the measurement circuit is adapted to ascertain from an input signal applied on the measurement signal input both a signal frequency as well as also a signal amplitude; and
the measurement and control circuit is adapted to output on the amplitude output an amplitude sequence which is a sequence of amplitude values ascertained based on the input signal and on the frequency output a frequency sequence which is a sequence of frequency values ascertained based on the input signal.

13. A measurement system, comprising: a transmitter electronics as defined in claim 12, as well as a measuring transducer electrically connected to said transmitter electronics and adapted to register at least one physical, measured value and to transduce such into a corresponding measurement signal, in such a manner that the measurement signal follows a change of the physical, measured variable with a change of at least one signal parameter.

14. The measuring system as claimed in claim 13, wherein:
the frequency output of the measurement and control circuit is electrically connected with the frequency control input of the signal generator of the driver circuit, in such a manner that the frequency control value applied on its frequency control input corresponds to a frequency value of the frequency sequence;
the amplitude output of the measurement and control circuit is electrically connected with the amplitude input of the amplitude control of the driver circuit, in such a manner that the amplitude actual value on its amplitude input corresponds to an amplitude value of the amplitude sequence; and
the measuring transducer is electrically coupled with the measurement signal input of the measurement and control circuit, in such a manner that the measurement and control circuit receives the at least one measurement signal and that both the frequency as well as also the amplitude sequence are dependent on the measurement signal.

15. The measuring system as claimed in claim 14, wherein: the measurement and control circuit is adapted based on the measurement signal to ascertain measured values representing the at least one physical measured variable; and/or
the measuring transducer is coupled electrically and/or electromagnetically with the load circuit, in such a manner that behavior of the measurement signal as a function of time is dependent on behavior of the load current and/or the load voltage as a function of time; and/or
the measuring transducer includes a measuring tube which is adapted to convey a fluid measured material; and/or
the measuring transducer includes a permanent magnet which interacts with a coil integrated in the load circuit.

16. The measuring system as claimed in claim 13, further comprising:
an evaluation and supply unit, wherein:
the transmitter electronics is connected to the evaluation and supply unit.

17. The measuring system as claimed in claim 16, wherein:
the transmitter electronics draws electrical power from measurement and supply unit required for operation of the driver circuit.

18. The measuring system as claimed in claim 17, wherein:
the transmitter electronics transmits measurement data generated by means of the measurement and control circuit to the evaluation and supply unit.

* * * * *